(12) United States Patent
Takenaka et al.

(10) Patent No.: US 12,273,078 B2
(45) Date of Patent: Apr. 8, 2025

(54) POWER AMPLIFIER EVALUATION METHOD AND MEASUREMENT SYSTEM

(71) Applicant: Murata Manufacturing Co., Ltd., Kyoto (JP)

(72) Inventors: Kiichiro Takenaka, Kyoto (JP); Masahiro Ito, Kyoto (JP); Yuuma Noguchi, Kyoto (JP); Daiji Nagashima, Kyoto (JP); Hidetoshi Matsumoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 744 days.

(21) Appl. No.: 17/209,796

(22) Filed: Mar. 23, 2021

(65) Prior Publication Data
US 2021/0305950 A1    Sep. 30, 2021

(30) Foreign Application Priority Data
Mar. 24, 2020 (JP) .................................. 2020-052656

(51) Int. Cl.
*H03F 3/24* (2006.01)
(52) U.S. Cl.
CPC .......... *H03F 3/24* (2013.01); *H03F 2200/102* (2013.01); *H03F 2200/324* (2013.01); *H03F 2200/393* (2013.01); *H03F 2200/451* (2013.01)
(58) Field of Classification Search
CPC ................. H03F 3/24; H03F 2200/102; H03F 2200/324; H03F 2200/393; H03F 2200/451

USPC .......................................................... 330/10
See application file for complete search history.

(56) References Cited

U.S. PATENT DOCUMENTS

| | | | | |
|---|---|---|---|---|
| 5,678,198 | A * | 10/1997 | Lemson | H03G 3/3084 455/249.1 |
| 2014/0266423 | A1 * | 9/2014 | Drogi | H03F 1/32 330/75 |
| 2015/0061761 | A1 | 3/2015 | Wills et al. | |
| 2016/0156316 | A1 * | 6/2016 | Drogi | H03F 1/0227 330/291 |

FOREIGN PATENT DOCUMENTS

JP         2015511802 A        4/2015

OTHER PUBLICATIONS

Iversen et al., "Multilevel tracking power supply for switch-mode audio power amplifiers" Published in: Proceedings of APEC 2018 (Year: 2018).*

* cited by examiner

*Primary Examiner* — Hafizur Rahman
(74) *Attorney, Agent, or Firm* — MCDONALD HOPKINS LLC

(57) ABSTRACT

A radio frequency signal having a constant amplitude is modulated by a digital modulation signal and a radio frequency input signal whose amplitude changes stepwise is generated. The radio frequency input signal is input into a power amplifier that is an evaluation target. A period in which an amplitude of the radio frequency input signal is constant is defined as a measurement period and an output signal of the power amplifier is measured in each of measurement periods in which amplitudes of the radio frequency input signal are different from each other.

9 Claims, 7 Drawing Sheets

POWER AMPLIFIER EVALUATION METHOD AND MEASUREMENT SYSTEM

CROSS REFERENCE TO RELATED APPLICATION

This application claims priority from Japanese Patent Application No. 2020-052656 filed on Mar. 24, 2020. The content of this application is incorporated herein by reference in its entirety.

BACKGROUND

The present disclosure relates to a power amplifier evaluation method and a measurement system for measuring the characteristics of a power amplifier.

A known power amplifier employs the envelope tracking (ET) technique as a technique for improving the power-added efficiency of a power amplifier (e.g., Japanese Unexamined Patent Application Publication (Translation of PCT Application) No. 2015-511802). For the evaluation of characteristics of a power amplifier that operates in the ET system, a sweep of power of a radio frequency input signal is performed for each of a plurality of power supply voltages, and a radio frequency input signal, a radio frequency output signal, a power supply voltage, a power supply current, and the like are measured for each of the plurality of power supply voltages. For the evaluation of characteristics of a power amplifier employing the average power tracking (APT) technique, the sweep of a radio frequency input signal and the measurement are also performed.

When the characteristics of a power amplifier is evaluated, the sweep of power of a radio frequency input signal is performed for each measurement point at which the magnitude of a power supply voltage is fixed, and therefore a measurement time becomes long. The present disclosure provides a power amplifier evaluation method and a measurement system with which a measurement time can be reduced.

BRIEF SUMMARY

According to an aspect of the present disclosure, there is provided a power amplifier evaluation method including modulating a radio frequency signal having a constant amplitude by a digital modulation signal and generating a radio frequency input signal whose amplitude changes stepwise, inputting the radio frequency input signal into a power amplifier that is an evaluation target, and defining a period in which an amplitude of the radio frequency input signal is constant as a measurement period and measuring an output signal of the power amplifier in each of a plurality of measurement periods in which amplitudes of the radio frequency input signal are different from each other.

According to another aspect of the present disclosure, there is provided a measurement system including an input signal generator configured to modulate a radio frequency signal having a constant amplitude by a digital modulation signal, generate a radio frequency input signal whose amplitude changes stepwise, and input the radio frequency input signal into a power amplifier that is an evaluation target, a power supply configured to supply a power supply voltage to the power amplifier, a waveform measurement device configured to measure waveforms of a voltage and a current supplied from the power supply to the power amplifier, and a vector signal analyzer configured to measure power and a phase of an output signal of the power amplifier.

By causing the amplitude of a radio frequency input signal to change stepwise, the characteristics of a power amplifier can be measured under various output power conditions. Furthermore, since a radio frequency signal of a constant amplitude is modulated by a digital modulation signal and a radio frequency input signal is generated, a measurement time can be reduced as compared with the method of changing an amplitude by sweeping the amplitude of oscillation of an oscillator.

Other features, elements, characteristics and advantages of the present disclosure will become more apparent from the following detailed description of embodiments of the present disclosure with reference to the attached drawings.

DETAILED DESCRIPTION

First Embodiment

A power amplifier evaluation method according to a first embodiment and a measurement system according to the first embodiment will be described with reference to FIGS. 1 to 4C.

Figure 1:
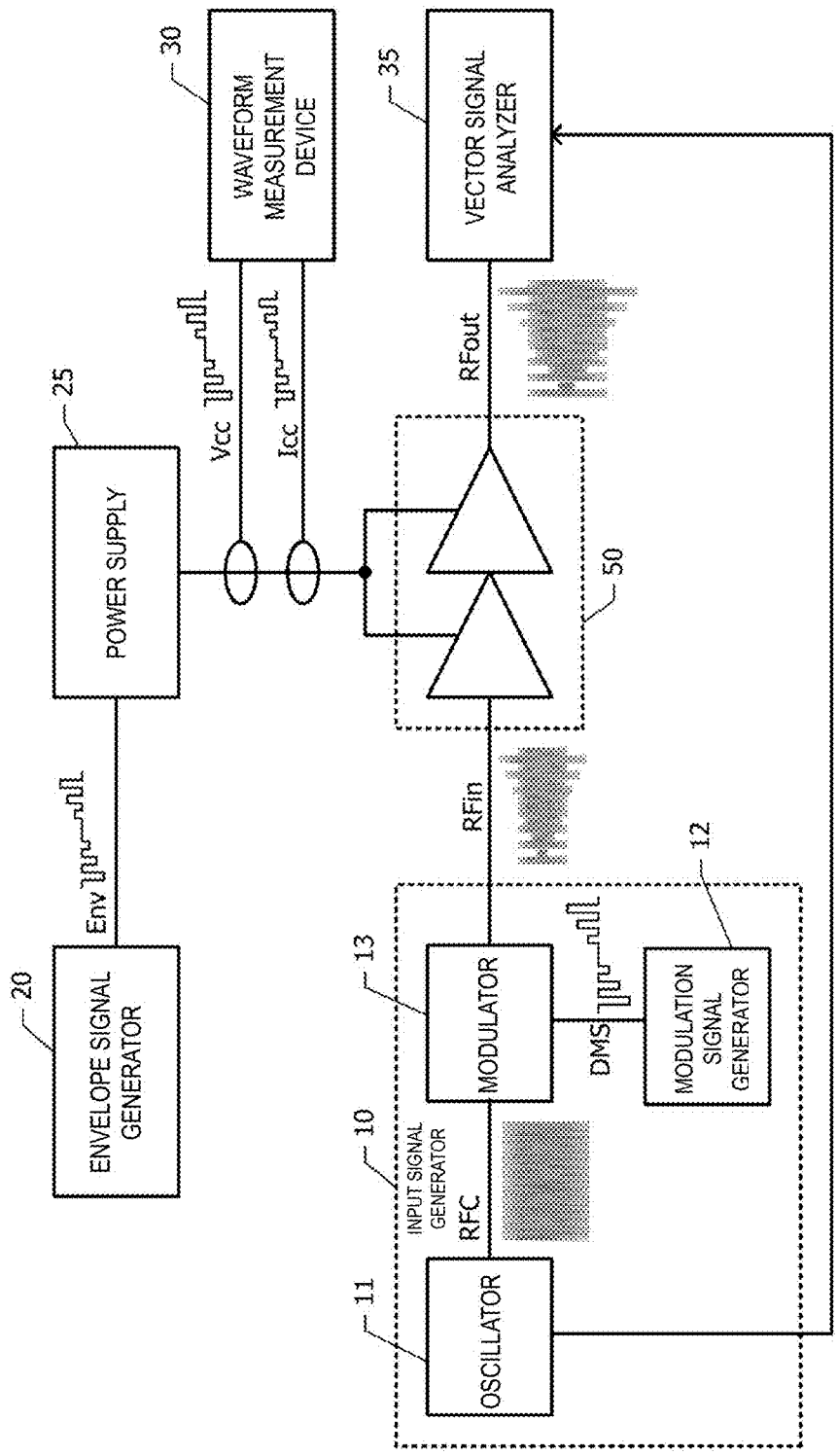
FIG. 1 is a block diagram of a measurement system according to a first embodiment.

FIG. 1 is a block diagram of a measurement system according to the first embodiment. A measurement system according to the first embodiment includes an input signal generator 10, an envelope signal generator 20, a power supply 25, a waveform measurement device 30, and a vector signal analyzer 35. A radio frequency input signal RFin output from the input signal generator 10 is input into a power amplifier 50 that is an evaluation target. Referring to FIG. 1, a waveform of the radio frequency input signal RFin is exemplarily illustrated. The waveforms of other signals are also exemplarily illustrated.

The input signal generator 10 includes an oscillator 11, a modulation signal generator 12, and a modulator 13. The oscillator 11 generates a radio frequency signal RFC of a constant frequency and a constant amplitude. The modulation signal generator 12 generates a digital modulation signal DMS. The digital modulation signal DMS includes a plurality of pulses intermittently, for example, periodically spaced on the time axis. Each of these pulses has a peak value corresponding to one of a plurality of evaluation levels set in advance.

The multiple evaluation levels include the level higher than a reference level, a level lower than the reference level, and the level equal to the reference level. When the evaluation level is equal to the reference level, a pulse waveform does not appear in the digital modulation signal DMS. However, it can be considered that the digital modulation signal DMS includes the pulse having a peak value corresponding to the level equal to the reference level. The modulator 13 changes the amplitude of the radio frequency signal RFC by the digital modulation signal DMS and generates the radio frequency input signal RFin whose amplitude changes stepwise.

The envelope signal generator 20 generates an envelope signal Env. An arbitrary waveform generator (AWG), for example, can be used as the envelope signal generator 20. Like the digital modulation signal DMS, the envelope signal Env includes a plurality of pulses intermittently, for example, periodically spaced on the time axis, each of which has a peak value corresponding to one of a plurality of evaluation levels set in advance.

The power supply 25 changes a power supply voltage Vcc to be supplied to the power amplifier 50 in accordance with the envelope signal Env. The power supply 25 includes a DC power supply and a power modulator. The power modulator changes (modulates) a constant voltage output from the DC power supply by the envelope signal Env. The output voltage of the power modulator is supplied to the power amplifier 50.

The waveform measurement device 30 measures the waveform (time change) of the power supply voltage Vcc and a power supply current Icc supplied from the power supply 25 to the power amplifier 50. An oscilloscope or a synchroscope, for example, can be used as the waveform measurement device 30. On the basis of the voltage waveform and the current waveform measured by the waveform measurement device 30, the instantaneous value of power to be supplied to the power amplifier 50 can be obtained.

The vector signal analyzer 35 measures the power and phase of a radio frequency output signal RFout output from the power amplifier 50. The radio frequency signal RFC generated by the oscillator 11 in the input signal generator 10 is used as a phase reference. That is, the vector signal analyzer 35 measures the amount of change in the phase of the radio frequency output signal RFout with respect to the radio frequency signal RFC.

Figure 2:
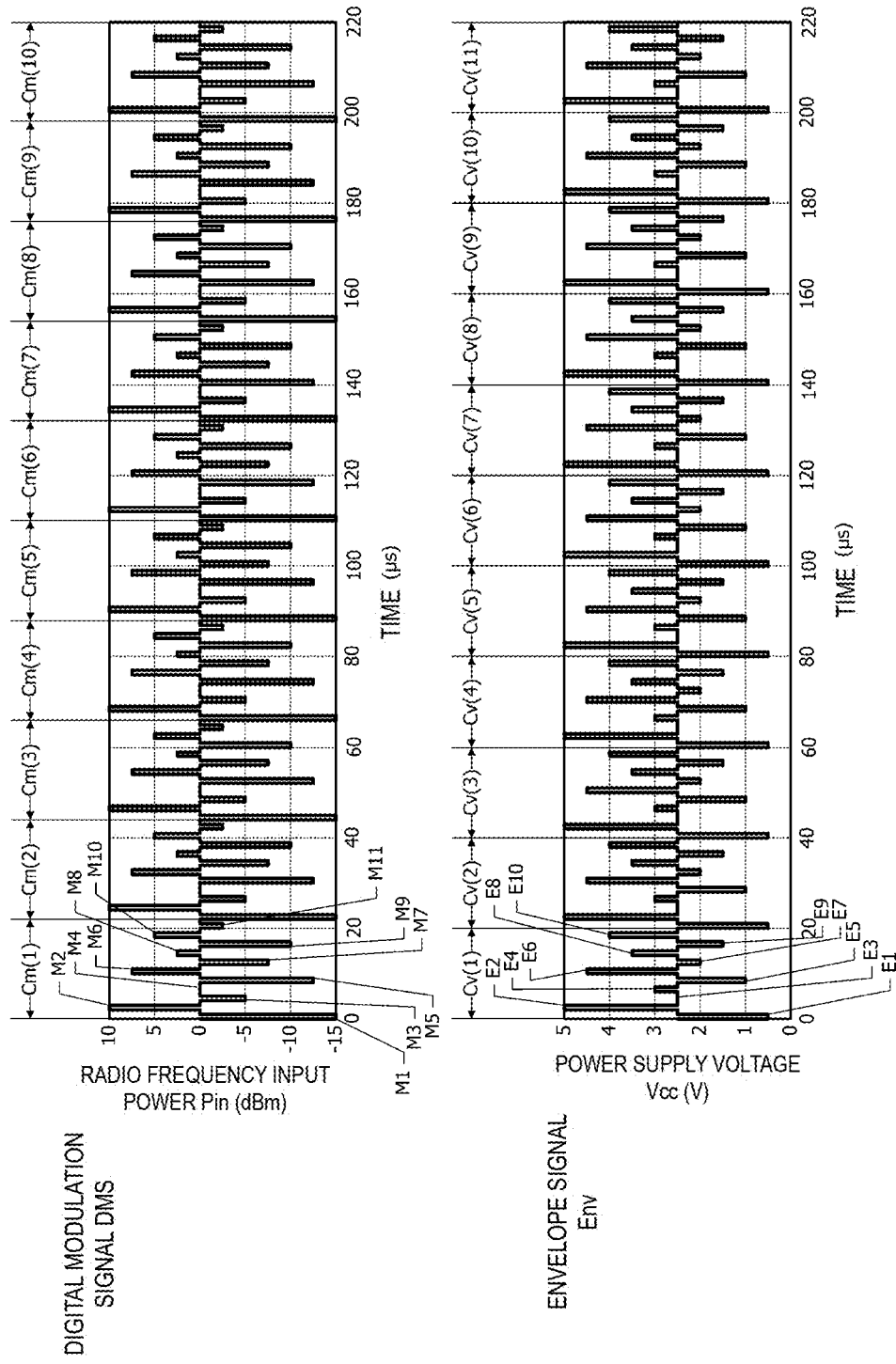
FIG. 2 is a graph representing exemplary waveforms of a digital modulation signal and an envelope signal.

FIG. 2 is a graph representing exemplary waveforms of the digital modulation signal DMS and the envelope signal Env. The upper graph represents the waveform of the digital modulation signal DMS and the lower graph represents the waveform of the envelope signal Env. In the upper and lower graphs, the horizontal axis represents time in units of "μs". In the upper graph, the vertical axis represents, in units of "dBm", power (radio frequency input power) Pin of the radio frequency input signal RFin modulated by the digital modulation signal DMS. In the lower graph, the vertical axis represents, in units of "V", the power supply voltage Vcc to be supplied to the power amplifier 50.

The digital modulation signal DMS includes eleven pulses M1 to M11 in each of a plurality of cycles Cm(i) where i is a positive integer and represents the order of a cycle. The peak values of the eleven pulses M1 to M11 in a single cycle Cm(i) differ from each other. The level of radio frequency input power Pin changes in accordance with the peak values of the pulses M1 to M11. For example, the value of the radio frequency input power Pin ranges from −15 dBm to +10 dBm in steps of 2.5 dBm. The pulses M1 to M11 have respective peak values, which are common in the multiple cycles Cm(i). The reference power level of the radio frequency input power Pin is set to 0 dBm. The radio frequency input power Pin is 0 dBm in a period in which the pulses of the digital modulation signal DMS do not appear.

The envelope signal Env includes ten pulses E1 to E10 in each of a plurality of cycles Cv(j) where j is a positive integer and represents the order of a cycle. The peak values of the ten pulses E1 to E10 in a single cycle Cv(j) differ from each other. The level of the power supply voltage Vcc changes in accordance with the peak values of the pulses E1 to E10. For example, the value of the power supply voltage Vcc ranges from 0 V to 5 V in steps of 0.5 V. The pulses E1 to E10 have respective peak values, which are common in the multiple cycles Cv(j). The reference power level of the power supply voltage Vcc is set to 2.5 V. The power supply voltage Vcc is 2.5 V in a period in which the pulses of the envelope signal Env do not appear.

The pulse repetition cycle (time interval at which a pulse is output) of the digital modulation signal DMS is the same as the pulse repetition cycle of the envelope signal Env and is, for example, 2 μs. Accordingly, the multiple pulses of the digital modulation signal DMS correspond one-to-one with the multiple pulses of the envelope signal Env on the time axis. The timing of the digital modulation signal DMS and the timing of the envelope signal Env are adjusted such that the radio frequency input signal RFin and the power supply voltage Vcc modulated by the corresponding pulses of the digital modulation signal DMS and the envelope signal Env are supplied to the power amplifier 50 at the same time. A duty ratio, which is the ratio of a pulse width to a pulse repetition cycle, is, for example, ½. A period in which pulses are generated is hereinafter referred to as "measurement period" and the other period is hereinafter referred to as "non-measurement period".

The total period of ten cycles from Cm(1) to Cm(10) of the digital modulation signal DMS is equal to the total period of eleven cycles from Cv(1) to Cv(11) of the envelope signal Env and is 220 μs. Within the total period of the ten cycles from Cm(1) to Cm(10) of the digital modulation signal DMS, all combinations of the eleven pulses M1 to M11 and the ten pulses E1 to E10, that is, 110 combinations, appear.

Figure 3:
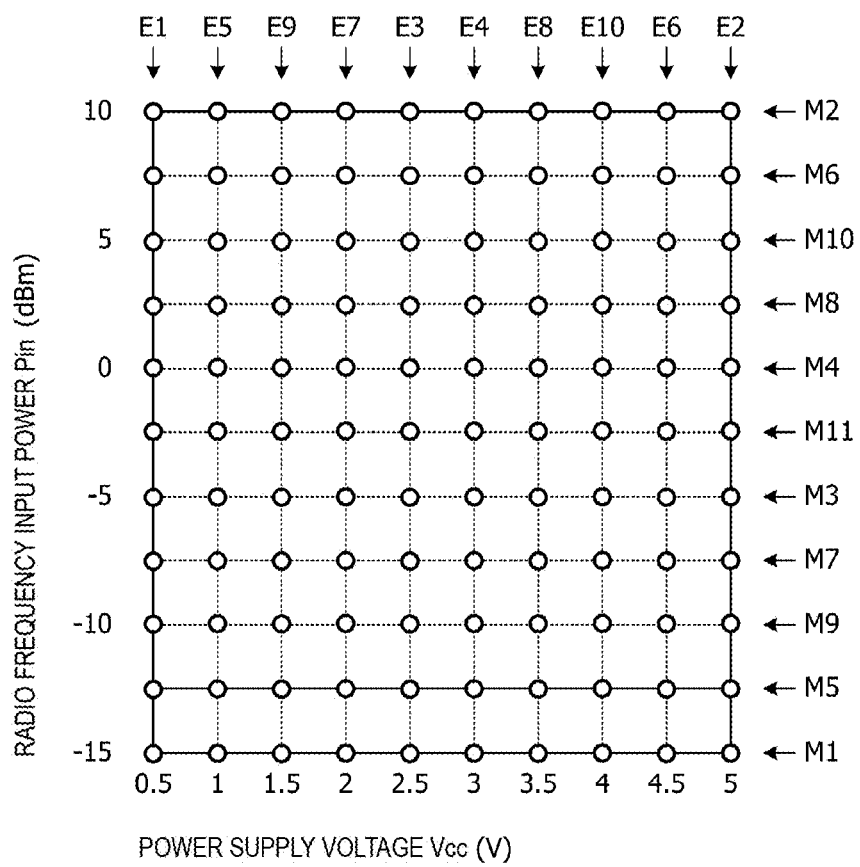
FIG. 3 is a diagram illustrating the combinations of the pulse of a digital modulation signal and the pulse of an envelope signal on a grid.

FIG. 3 is a diagram illustrating the combinations of the pulse of the digital modulation signal DMS and the pulse of the envelope signal Env on a grid. Each of a plurality of rows of the grid in FIG. 3 corresponds to corresponding one of the eleven pulses M1 to M11 of the digital modulation signal DMS. That is, each of the multiple rows is associated with a level (hereinafter referred to as "evaluation power level") in the single measurement period of the radio frequency input power Pin. Each of a plurality of columns of the grid in FIG. 3 corresponds to corresponding one of the ten pulses E1 to E10 of the envelope signal Env. That is, each of the multiple columns is associated with a single level (hereinafter referred to as "evaluation voltage level") of the power supply voltage Vcc.

Each of a plurality of grid points of the grid corresponds to the combination of an evaluation power level and an evaluation voltage level in a single measurement period. It is apparent from the drawing that all the combinations of the eleven evaluation power levels and the ten evaluation voltage levels appear. The numbers of evaluation power levels and evaluation voltage levels do not necessarily have to be ten and eleven, respectively. The single cycle Cm(i) (FIG. 2)

may include multiple pulses other than eleven pulses and the single cycle Cv(j) (FIG. 2) may include multiple pulses other than ten pulses. That is, measurement may be performed for all combinations of a plurality of evaluation power levels and a plurality of evaluation voltage levels.

Figure 4A:
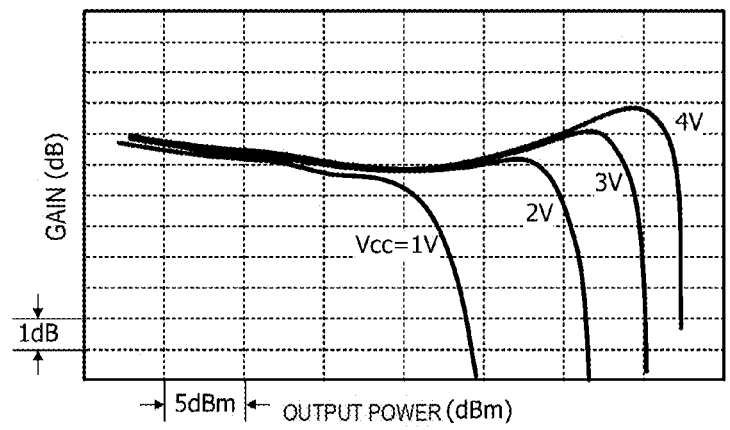
FIGS. 4A, 4B, and 4C are graphs that represent the gain characteristics, phase characteristics, and power-added efficiency characteristics of a power amplifier, respectively measured by a measurement system according to the first embodiment.
Figure 4B:
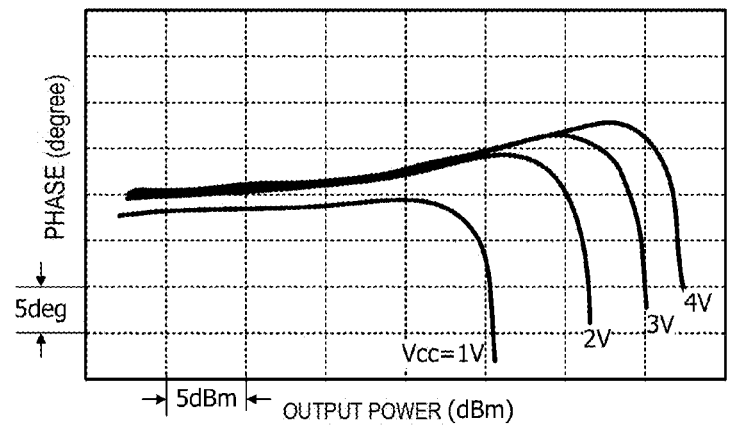
Figure 4C:
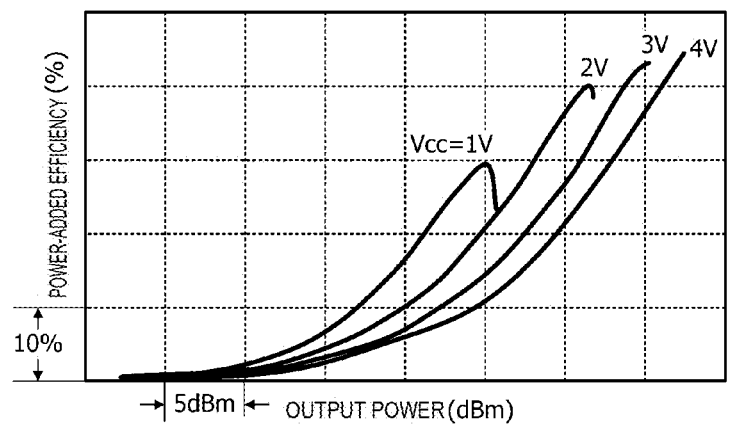

FIGS. 4A, 4B, and 4C are graphs that represent the gain characteristics, phase characteristics, and power-added efficiency characteristics of the power amplifier 50, respectively, measured by a measurement system according to the first embodiment. The horizontal axes in FIGS. 4A, 4B, and 4C represent the power (output power) of the radio frequency output signal RFout, and a single scale corresponds to 5 dBm. The vertical axis in FIG. 4A represents gain, and a single scale corresponds to 1 dB. The vertical axis in FIG. 4B represents phase, and a single scale corresponds to 5°. The vertical axis in FIG. 4C represents power-added efficiency, and a single scale corresponds to 10%.

A gain can be obtained on the basis of the power measurement values of the radio frequency output signal RFout and the radio frequency input signal RFin in each measurement period. The power of the radio frequency output signal RFout is measured by the vector signal analyzer 35 in each measurement period. The power of the radio frequency input signal RFin can be calculated on the basis of the output power of the oscillator 11 and the peak value of the pulse of the digital modulation signal DMS in each measurement period.

A phase is obtained by the vector signal analyzer 35 that detects in each measurement period the phase of the radio frequency output signal RFout with respect to the phase of the radio frequency signal RFC output from the oscillator 11.

Power-added efficiency can be obtained on the basis of the measurement value of the magnitude of DC power supplied to the power amplifier 50, the measurement value of the power of the radio frequency output signal RFout, and the measurement value of the power of the radio frequency input signal RFin in each measurement period. The magnitude of DC power can be calculated on the basis of the instantaneous value of the voltage waveform of the power supply voltage Vcc and the instantaneous value of the current waveform of the power supply current Icc measured by the waveform measurement device 30.

Numeric values assigned to four curves in the graphs in FIGS. 4A, 4B, and 4C represent the power supply voltage Vcc. In measurement, 80 evaluation power levels are set in steps of approximately 0.32 dB in the range from −15 dBm to +10 dBm and 81 evaluation voltage levels are set in steps of 0.05 V in the range from 0.5 V to 4.5 V. FIGS. 4A, 4B, and 4C illustrate only four measurement results when the power supply voltage Vcc is set to 1V, 2V, 3V, and 4V among the 81 evaluation voltage levels.

The frequency of the radio frequency signal RFC is set to 1.950 GHz. The pulse repetition cycles of the digital modulation signal DMS and the envelope signal Env are set to 8 μs. Since the number of combinations of the 80 evaluation power levels and the 81 evaluation voltage levels is 6480, measurement can be performed for all the combinations in 51.8 ms.

Next, the effects of the first embodiment will be described. In the first embodiment, measurement is performed at a plurality of evaluation voltage levels of the power supply voltage Vcc to the power amplifier 50 (FIG. 1). Accordingly, as illustrated in FIGS. 4A, 4B, and 4C, the gain characteristics, the phase characteristics, and the power-added efficiency characteristics can be measured under a plurality of conditions in which values of the power supply voltage Vcc are different from each other. When the power amplifier 50 operates in the envelope tracking system, the conditions of the power supply voltage, under which maximum power-added efficiency is obtained, can be obtained on the basis of the results of measurement. Furthermore, power supply voltage conditions, under which gain characteristics and phase characteristics are optimized, can be obtained.

In the first embodiment, the power of the radio frequency input signal RFin to be supplied to the power amplifier 50 (FIG. 1) is changed by modulating the radio frequency signal RFC having a constant amplitude by the digital modulation signal DMS. In general, this method can more rapidly change the power of a radio frequency input signal as compared with a method of changing the power of a radio frequency input signal to be supplied to a power amplifier by sweeping the amplitude of oscillation of an oscillator. Accordingly, the time taken for measurement can be reduced.

In the first embodiment, the radio frequency input power Pin is set to a reference power level and the power supply voltage Vcc is set to a reference voltage level in a period (the non-measurement period) other than the measurement period in which the pulses of the digital modulation signal DMS (FIG. 2) and the envelope signal Env (FIG. 2) are generated. The reference power level and the reference voltage level may be set to be substantially equal to average input power and an average voltage, respectively, at the time of the actual operation of the power amplifier 50. A temperature increased because of the self-heating of the power amplifier 50 during measurement can therefore be made closer to a temperature increased because of the self-heating of the power amplifier 50 during an actual operation. As a result, temperature conditions during measurement can be made closer to temperature conditions during an actual operation.

Next, a measurement system that is a modification of the first embodiment will be described with reference to FIGS. 5A to 6B.

Figure 5A:
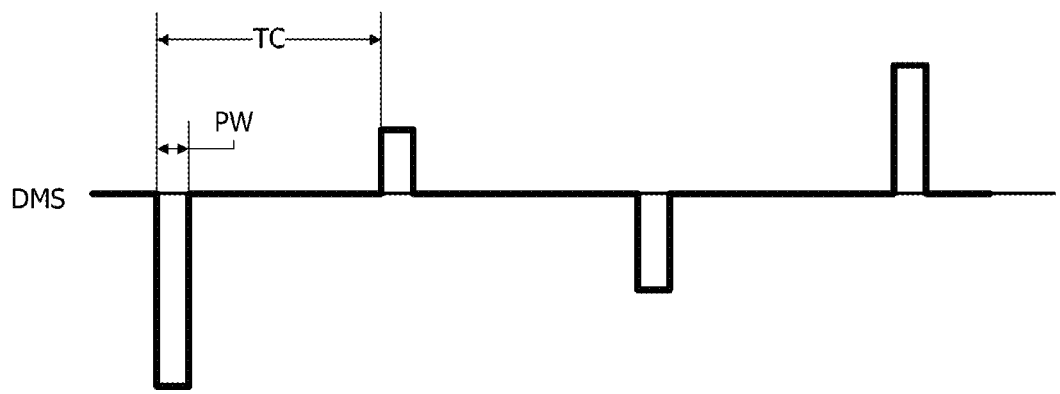
FIGS. 5A and 5B are graphs each representing the waveform of a digital modulation signal used in a measurement system that is a modification of the first embodiment.

FIG. 5A is a graph representing the waveform of the digital modulation signal DMS used in a measurement system that is a modification of the first embodiment. A pulse repetition cycle is represented by TC and a pulse width is represented by PW. A duty ratio PW/TC is set to ½ in the first embodiment, but may be a value other than ½. In the modification illustrated in FIG. 5A, the duty ratio PW/TC is set to ⅛. For example, the pulse width PW is 1 μs and the pulse repetition cycle TC is 8 μs. Accordingly, the length of the non-measurement period in a single cycle is 7 μs.

Like in the modification illustrated in FIG. 5A, when the duty ratio is reduced, the proportion of the non-measurement period on the time axis increases. As a result, the proportion of the period in which the radio frequency input power Pin is set to the reference power level and the power supply voltage Vcc is set to the reference voltage level increases. The temperature increased because of self-heating during measurement can therefore be made closer to the temperature increased because of self-heating during an actual operation. The duty ratio can be set to ½ or less to make temperature conditions during measurement closer to temperature conditions during an actual operation.

Figure 5B:
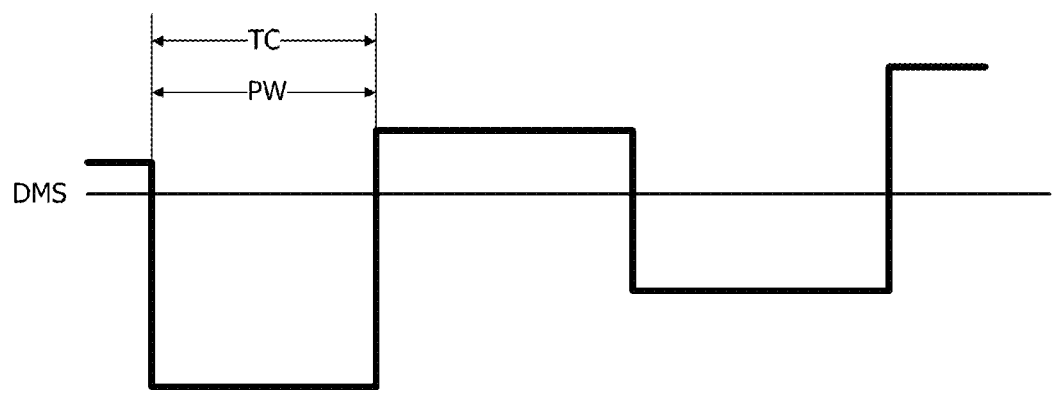

FIG. 5B is a graph representing the waveform of the digital modulation signal DMS used in a measurement system that is another modification. In this modification, the pulse repetition cycle TC and the pulse width PW are the same. That is, the duty ratio PW/TC is 1. Accordingly, the non-measurement period does not appear between the two adjacent measurement periods on the time axis.

Even if the duty ratio PW/TC is set to 1 like in the modification illustrated in FIG. 5B, the characteristics of the power amplifier 50 can be measured. Since the non-measurement period does not appear in this modification, the time taken for measurement can be reduced. Since the non-measurement period in which the radio frequency input power Pin is set to the reference power level and the power supply voltage Vcc is set to the reference voltage level does not appear, this modification is at a disadvantage compared with the first embodiment from the viewpoint of making temperature conditions during measurement closer to temperature conditions during an actual operation.

In this modification, a pulse appearance order may be adjusted such that, in the single cycle Cm(i) (FIG. 2) of the digital modulation signal DMS, a peak value of one of the two adjacent pulses on the time axis is less than or equal to an average of peak values of a plurality of pulses and a peak value of the other of the two adjacent pulses on the time axis is greater than the average of peak values. By adjusting the pulse appearance order as above, the increase in temperature because of self-heating during measurement can be temporally leveled out.

Figure 6A:
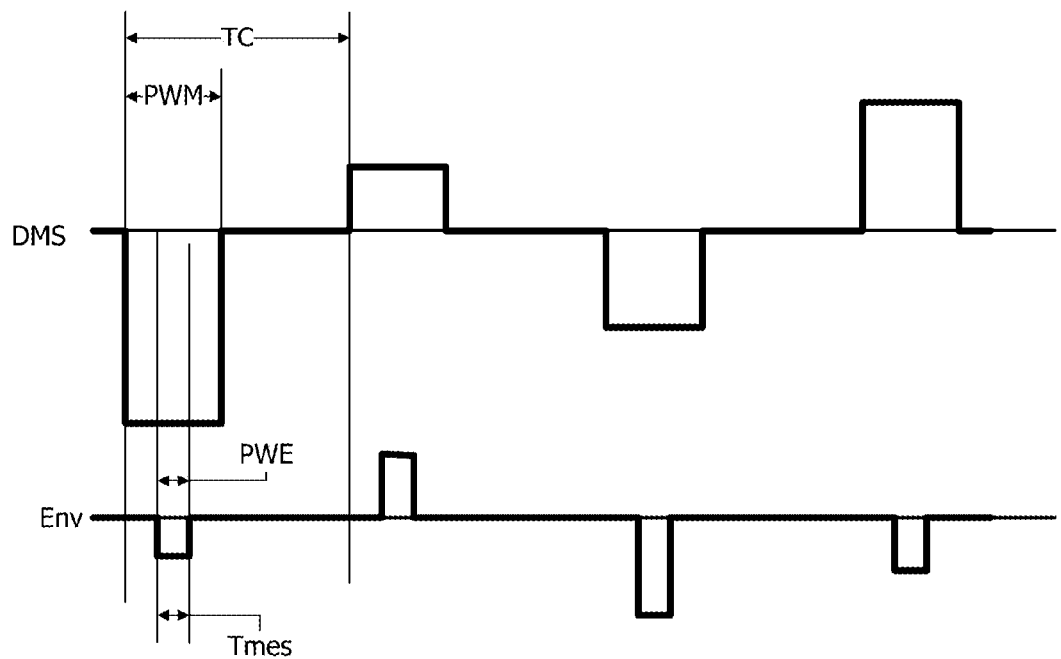
FIGS. 6A and 6B are graphs each representing the waveforms of a digital modulation signal and an envelope signal used in a measurement system that is another modification of the first embodiment.

FIG. 6A is a graph representing the waveforms of the digital modulation signal DMS and the envelope signal Env used in a measurement system that is still another modification of the first embodiment. In the first embodiment, the pulse widths of the digital modulation signal DMS and the envelope signal Env are the same. In contrast, in this modification, a pulse width PWM of the digital modulation signal DMS is longer than a pulse width PWE of the envelope signal Env. Pulse repetition cycles TC of the digital modulation signal DMS and the envelope signal Env are the same.

The pulse of the envelope signal Env is included in the pulse of the digital modulation signal DMS on the time axis. In the comparison between the timing of the pulse of the envelope signal Env and the timing of the pulse of the digital modulation signal DMS, a base point in time is not a point in time when a pulse is output from the modulation signal generator (FIG. 1) or a point in time when a pulse is output from the envelope signal generator 20 (FIG. 1) but a point in time when a pulse is input into the power amplifier 50.

In the modification illustrated in FIG. 6A, a period within the pulse width of the envelope signal Env is a measurement period Tmes. On the basis of the power measurement value of the radio frequency output signal RFout and the measurement values of the power supply voltage Vcc and the power supply current Icc in the measurement period Tmes, the characteristics of the power amplifier 50 are obtained.

The pulse width PWM of the digital modulation signal DMS is set to be longer than the pulse width PWE of the envelope signal Env in the modification illustrated in FIG. 6A. However, the pulse width PWE of the envelope signal Env may be set to be longer than the pulse width PWM of the digital modulation signal DMS. In this case, the pulse of the digital modulation signal DMS is included in the pulse of the envelope signal Env on the time axis.

Figure 6B:
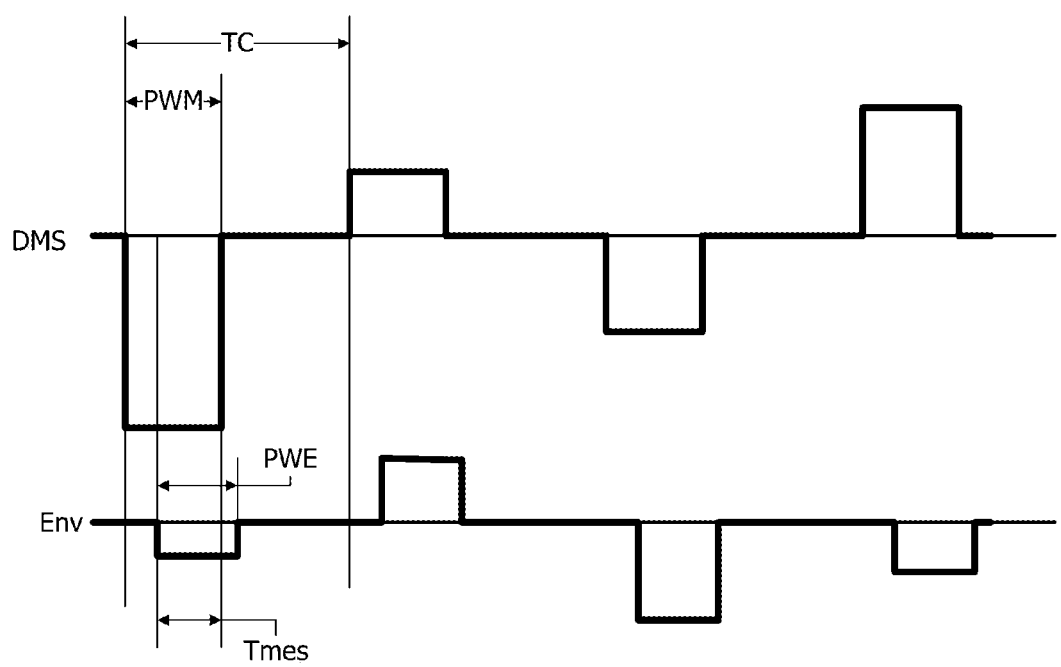

FIG. 6B is a graph representing the waveforms of the digital modulation signal DMS and the envelope signal Env used in a measurement system that is still another modification. In the modification illustrated in FIG. 6A, one of the pulses of the digital modulation signal DMS and the envelope signal Env is included in the other one of them on the time axis. In the modification illustrated in FIG. 6B, the pulse of the digital modulation signal DMS partly overlaps the pulse of the envelope signal Env. The magnitude relationship between the pulse width PWM of the digital modulation signal DMS and the pulse width PWE of the envelope signal Env may be optionally set. A period in which both of these pulses overlap is the measurement period Tmes.

Even if the pulse width PWM of the digital modulation signal DMS and the pulse width PWE of the envelope signal Env are not the same like in the modifications illustrated in FIGS. 6A and 6B, a measurement time can be reduced and temperature conditions during measurement can be made closer to temperature conditions during an actual operation like in the first embodiment.

Second Embodiment

Next, a power amplifier evaluation method according to a second embodiment and a measurement system according to the second embodiment will be described with reference to FIG. 7. The description of matters common to those in the power amplifier evaluation method according to the first embodiment and the measurement system according to the first embodiment illustrated in FIGS. 1 to 4C will be omitted.

Figure 7:
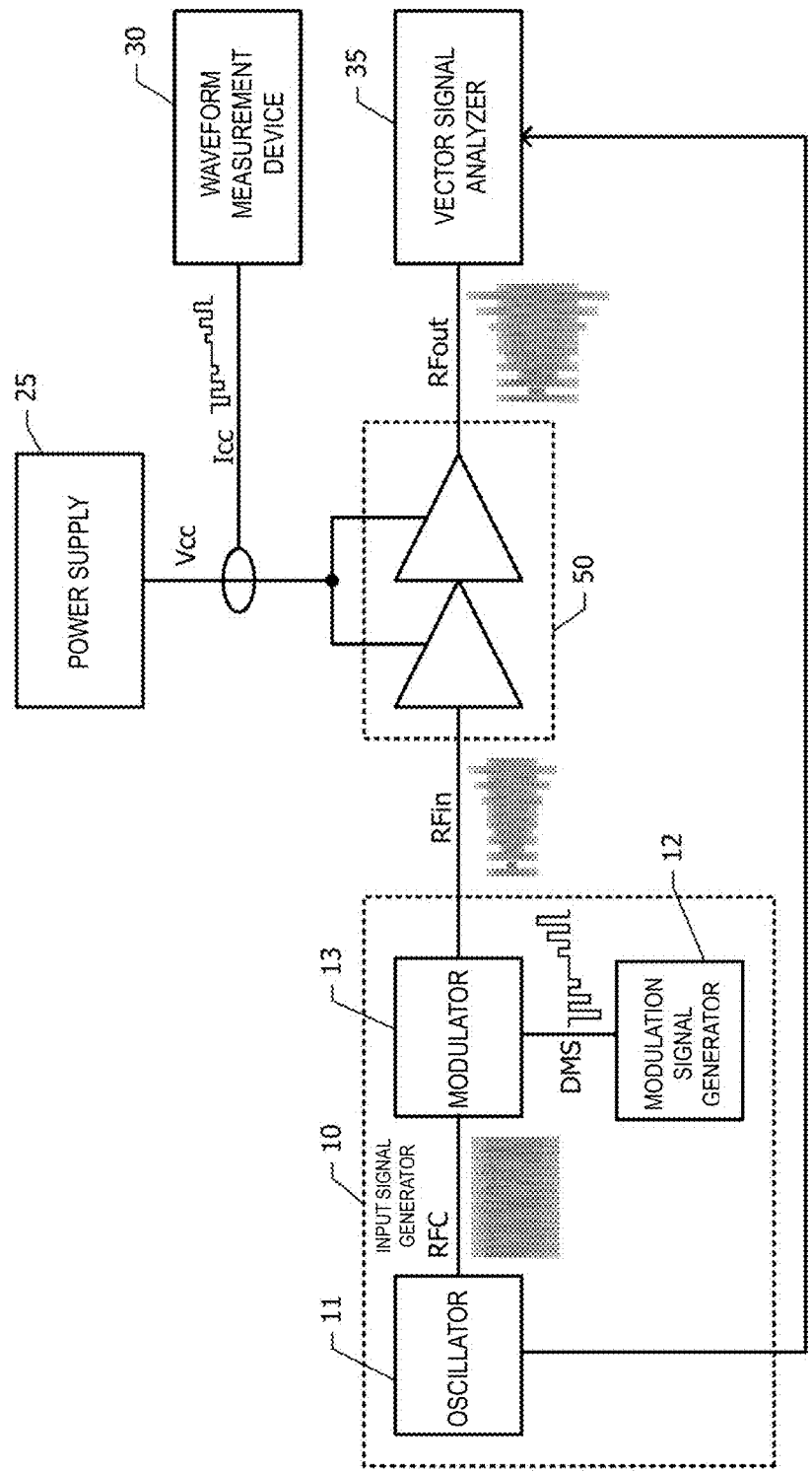
FIG. 7 is a block diagram of a measurement system according to a second embodiment.

FIG. 7 is a block diagram of a measurement system according to the second embodiment. Although the power supply 25 (FIG. 1) changes the power supply voltage Vcc to be supplied to the power amplifier 50 in accordance with the envelope signal Env in the first embodiment, the power supply 25 supplies a fixed and constant power supply voltage Vcc to the power amplifier 50 in the second embodiment. Since the power supply voltage Vcc is constant, the waveform measurement device 30 does not need to measure the waveform of the power supply voltage Vcc and measures the waveform of the power supply current Icc.

In the second embodiment, the measurement of a gain, a phase, and power-added efficiency is performed under conditions in which the power supply voltage Vcc is constant.

Next, the effects of the second embodiment will be described. Since the radio frequency input signal RFin is generated by modulating the radio frequency signal RFC having a constant amplitude also in the second embodiment, a measurement time can be reduced like in the first embodiment. Furthermore, by setting the duty ratio of the digital modulation signal DMS to a value less than 1 to set the non-measurement period, temperature conditions during measurement can be made closer to temperature conditions during an actual operation like in the first embodiment. A measurement system according to the second embodiment can be used for the evaluation of characteristics of the power amplifier 50 that operates in an average power tracking (APT) system.

The embodiments described above are illustrative, and, needless to say, a partial replacement or combination of configurations described in different embodiments is possible. The similar operational effects achieved by the similar configurations in the multiple embodiments are not mentioned in each of the embodiments. Furthermore, the present disclosure is not limited to the embodiments described above. For example, it is obvious for those skilled in the art that various changes, improvements, combinations, and the like can be made.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier evaluation method comprising:
modulating a radio frequency signal having a constant amplitude with a digital modulation signal, thereby generating a radio frequency input signal whose amplitude changes in a stepwise manner;
inputting the radio frequency input signal into a power amplifier, the power amplifier being an evaluation target; and
measuring a radio frequency output signal of the power amplifier in each of a plurality of measurement periods, each measurement period being a time period in which the amplitude of the radio frequency input signal is constant and different than another measurement period,
wherein adjacent measurement periods are separated by non-measurement periods in which the radio frequency output signal is not measured.

2. The power amplifier evaluation method according to claim 1, wherein:
a power of the radio frequency input signal is a constant reference power level in at least one of the non-measurement periods, and
a power supply voltage supplied to the power amplifier is a constant reference voltage level in at least the non-measurement period.

3. The power amplifier evaluation method according to claim 1, further comprising:
changing a power supply voltage supplied to the power amplifier to correspond to each of the plurality of measurement periods.

4. The power amplifier evaluation method according to claim 3, wherein:
a power of the radio frequency input signal in each of the plurality of measurement periods is an evaluation power level,
a magnitude of the power supply voltage in each of the plurality of measurement periods is an evaluation voltage level, and
the radio frequency output signal of the power amplifier is measured for all combinations of evaluation power levels and evaluation voltage levels.

5. The power amplifier evaluation method according to claim 1, further comprising:
measuring waveforms of a power supply voltage and a power supply current supplied to the power amplifier; and
measuring characteristics of the power amplifier based on measurement values of the power supply voltage and the power supply current, and based on a measurement value of the radio frequency output signal of the power amplifier.

6. The power amplifier evaluation method according to claim 1, wherein a phase of the radio frequency output signal of the power amplifier is measured based on a phase of the radio frequency signal prior to being modulated by the digital modulation signal.

7. A measurement system comprising:
an input signal generator configured to modulate a radio frequency signal having a constant amplitude by a digital modulation signal, to generate a radio frequency input signal whose amplitude changes stepwise, and to input the radio frequency input signal into a power amplifier, the power amplifier being an evaluation target;
a power supply configured to supply a power supply voltage to the power amplifier;
a waveform measurement device configured to measure waveforms of a voltage and a current supplied from the power supply to the power amplifier; and
a vector signal analyzer configured to measure a power and a phase of an output signal of the power amplifier in each of a plurality of measurement periods,
wherein adjacent measurement periods are separated by non-measurement periods in which the output signal is not measured, and
wherein the duty ratio of the digital modulation signal is one half or less.

8. The measurement system according to claim 7, further comprising:
an envelope signal generator configured to supply, to the power supply, an envelope signal whose voltage level changes in a stepwise manner,
wherein the power supply is configured to change a voltage supplied to the power amplifier in accordance with the envelope signal supplied from the envelope signal generator.

9. The power amplifier evaluation method according to claim 1, wherein the duty ratio of the digital modulation signal is one half or less.

* * * * *

UNITED STATES PATENT AND TRADEMARK OFFICE
CERTIFICATE OF CORRECTION

| | |
|---|---|
| PATENT NO. | : 12,273,078 B2 |
| APPLICATION NO. | : 17/209796 |
| DATED | : April 8, 2025 |
| INVENTOR(S) | : Kiichiro Takenaka et al. |

Page 1 of 1

It is certified that error appears in the above-identified patent and that said Letters Patent is hereby corrected as shown below:

In the Specification

Column 7; Line 40: "generator (FIG. 1) or a" should be --generator 12 (FIG. 1) or a--.

Signed and Sealed this
Third Day of June, 2025

Coke Morgan Stewart
*Acting Director of the United States Patent and Trademark Office*